United States Patent
Duarte et al.

(10) Patent No.: US 10,352,526 B2
(45) Date of Patent: Jul. 16, 2019

(54) COOLING MEMBER FOR LIGHTING AND/OR SIGNALING SYSTEM

(71) Applicant: Valeo Vision, Bobigny (FR)

(72) Inventors: Marc Duarte, Villemomble (FR); Eric Stefura, Saint-Maur-des-Fosses (FR); Paul Jacquemin, Paris (FR); Christophe Cleto, Paris (FR); Lotfi Redjem Saad, Paris (FR); Brahim El Hachir, Paris (FR)

(73) Assignee: Valeo Vision, Bobigny (FR)

( * ) Notice: Subject to any disclaimer, the term of this patent is extended or adjusted under 35 U.S.C. 154(b) by 59 days.

(21) Appl. No.: 15/500,695

(22) PCT Filed: Aug. 4, 2015

(86) PCT No.: PCT/EP2015/067992
§ 371 (c)(1),
(2) Date: Jan. 31, 2017

(87) PCT Pub. No.: WO2016/030156
PCT Pub. Date: Mar. 3, 2016

(65) Prior Publication Data
US 2017/0219182 A1     Aug. 3, 2017

(30) Foreign Application Priority Data

Aug. 29, 2014   (FR) ..................... 14 58137

(51) Int. Cl.
| | |
|---|---|
| *F21V 29/74* | (2015.01) |
| *F21S 45/47* | (2018.01) |
| *F21S 45/49* | (2018.01) |
| *F21S 41/147* | (2018.01) |
| *F21S 43/14* | (2018.01) |
| *F21V 29/83* | (2015.01) |
| *H01L 23/367* | (2006.01) |
| *H01L 23/40* | (2006.01) |

(Continued)

(52) U.S. Cl.
CPC ............. *F21S 45/47* (2018.01); *B60Q 1/04* (2013.01); *F21S 41/147* (2018.01); *F21S 43/14* (2018.01);
(Continued)

(58) Field of Classification Search
CPC .......... F21S 45/47; F21S 41/147; F21S 43/14; F21S 48/1159; F21S 48/215;
(Continued)

(56) References Cited

U.S. PATENT DOCUMENTS 4,588,023 A * 5/1986 Munekawa ......... F28D 15/0266
165/104.21
6,208,517 B1 * 3/2001 Prince ................. H01L 23/3672
165/185

(Continued)

FOREIGN PATENT DOCUMENTS

| CN | 202056819 | 11/2011 |
|---|---|---|
| CN | 103185328 | 7/2013 |

(Continued)

*Primary Examiner* — Bao Q Truong
*Assistant Examiner* — Fatima N Farokhrooz
(74) *Attorney, Agent, or Firm* — Oblon, McClelland, Maier & Neustadt, L.L.P.

(57) ABSTRACT

A cooling member for a lighting and/or signaling system for a motor vehicle comprising a base and at least one heat dissipating device with a thermal conduction link to the base, the dissipating device comprising a plurality of dissipating elements, wherein each dissipating element comprises at least one dissipating wall extending from a fixing face.
The embodiments relate also to a lighting and/or signaling system and to a method for producing the cooling member.

20 Claims, 13 Drawing Sheets

(51) Int. Cl.

| | | |
|---|---|---|
| *F21V 29/70* | (2015.01) | |
| *B60Q 1/04* | (2006.01) | |
| *F21Y 115/10* | (2016.01) | |
| *F21Y 105/12* | (2016.01) | |
| *F21S 41/30* | (2018.01) | |
| *F21S 43/30* | (2018.01) | |

(52) U.S. Cl.
CPC ............. *F21S 45/49* (2018.01); *F21V 29/70* (2015.01); *F21V 29/74* (2015.01); *F21V 29/83* (2015.01); *H01L 23/3672* (2013.01); *H01L 23/4006* (2013.01); *F21S 41/30* (2018.01); *F21S 43/30* (2018.01); *F21Y 2105/12* (2016.08); *F21Y 2115/10* (2016.08); *H01L 2924/0002* (2013.01)

(58) Field of Classification Search
CPC .......... F21S 48/328; F21S 41/30; F21S 43/30; F21S 48/13; F21S 48/23; F21S 45/49; B60Q 1/04; H01L 23/3672; H01L 23/4006; H01L 2924/0002; F21V 29/70; F21V 29/74; F21V 41/30; F21V 29/83; F21Y 2105/12; F21Y 2115/10
See application file for complete search history.

(56) References Cited

U.S. PATENT DOCUMENTS

| | | | |
|---|---|---|---|
| 6,615,910 B1* | 9/2003 | Joshi | F28F 3/02 165/185 |
| 6,749,009 B2* | 6/2004 | Barten | F28F 3/025 165/131 |
| 6,821,143 B2 | 11/2004 | Gasquet et al. | |
| 7,210,833 B2 | 5/2007 | Gasquet et al. | |
| 7,408,779 B1* | 8/2008 | Shu | H01L 23/3672 361/707 |
| 7,492,599 B1 | 2/2009 | Yu et al. | |
| 8,926,141 B2 | 1/2015 | Yeh | |
| 2003/0164357 A1* | 9/2003 | Hedberg | B23K 9/1006 219/98 |
| 2004/0029436 A1 | 2/2004 | Gasquet et al. | |
| 2004/0190294 A1 | 9/2004 | Gasquet et al. | |
| 2007/0053168 A1 | 3/2007 | Sayir et al. | |
| 2007/0076422 A1* | 4/2007 | Nicolai | B60Q 1/0041 362/547 |
| 2007/0147046 A1* | 6/2007 | Arik | F21V 29/02 362/294 |
| 2009/0262549 A1* | 10/2009 | Inoue | F21V 29/75 362/547 |
| 2010/0002453 A1 | 1/2010 | Wu et al. | |
| 2010/0073642 A1* | 3/2010 | Sueoka | G03B 21/16 353/54 |
| 2011/0278633 A1 | 11/2011 | Clifford | |
| 2014/0153248 A1 | 6/2014 | Yeh | |

FOREIGN PATENT DOCUMENTS

| | | |
|---|---|---|
| CN | 203273812 | 11/2013 |
| DE | 102009007612 A1 | 8/2009 |
| FR | 2840151 A1 | 11/2003 |
| FR | 2853200 A1 | 10/2004 |
| JP | 2008059965 A | 3/2008 |
| JP | 2010146817 A | 7/2010 |
| WO | 2005116520 A1 | 12/2005 |

* cited by examiner

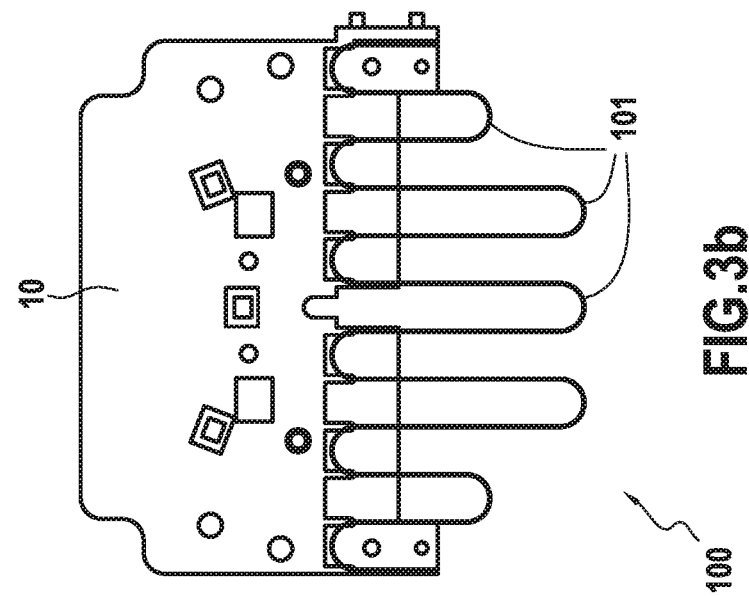
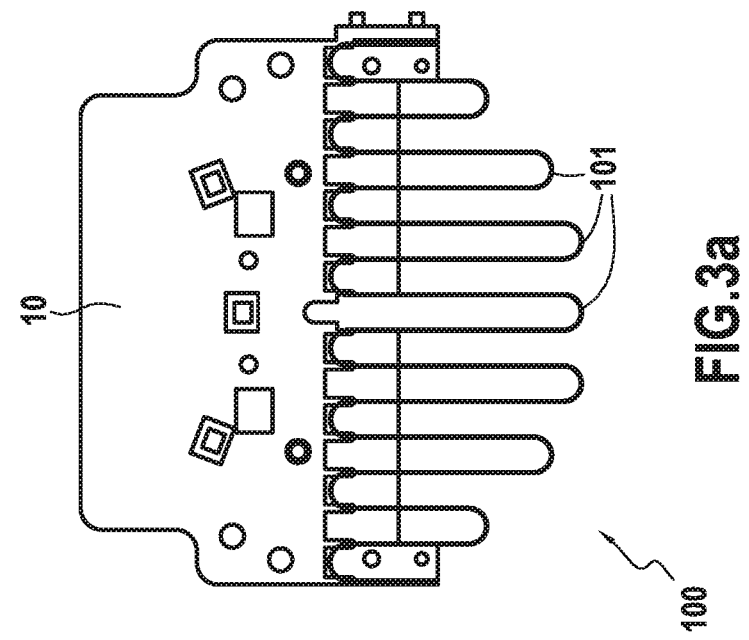

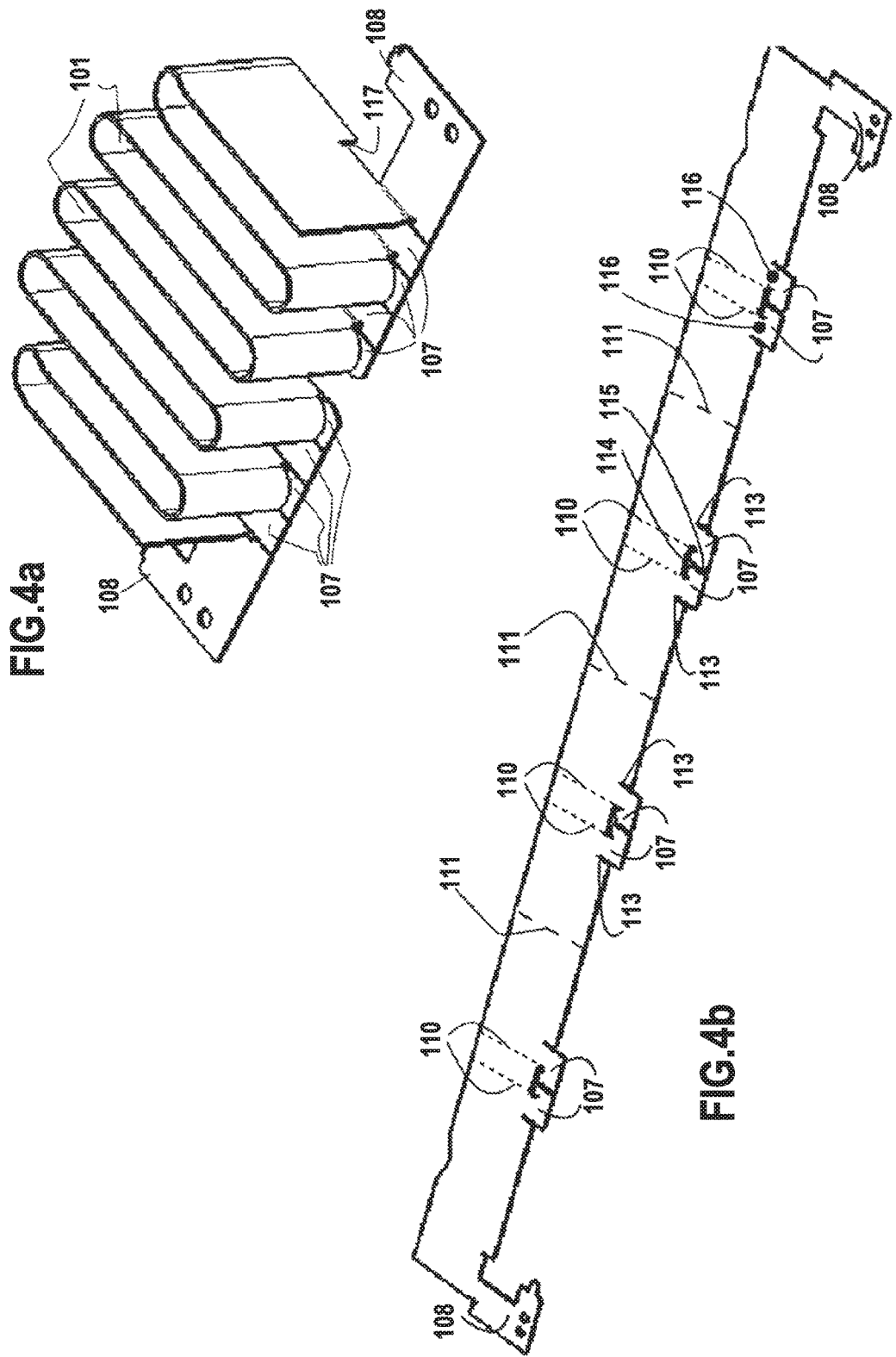

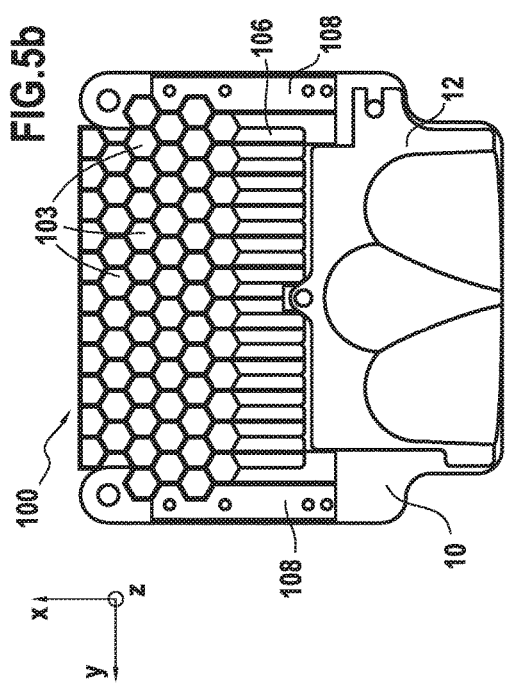
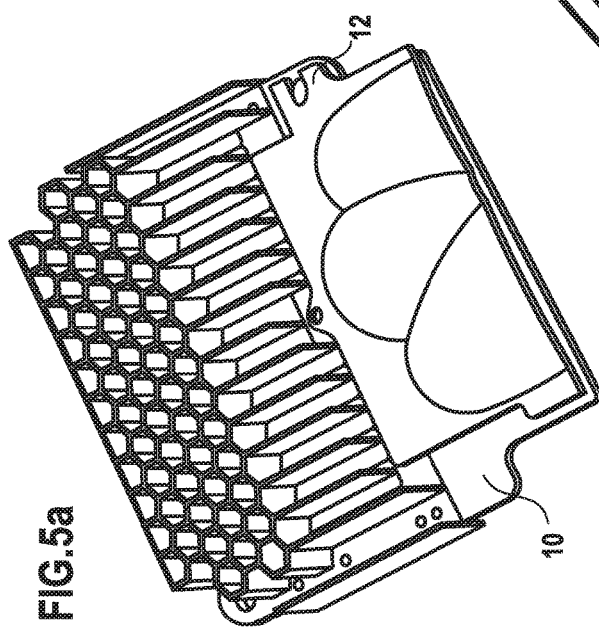
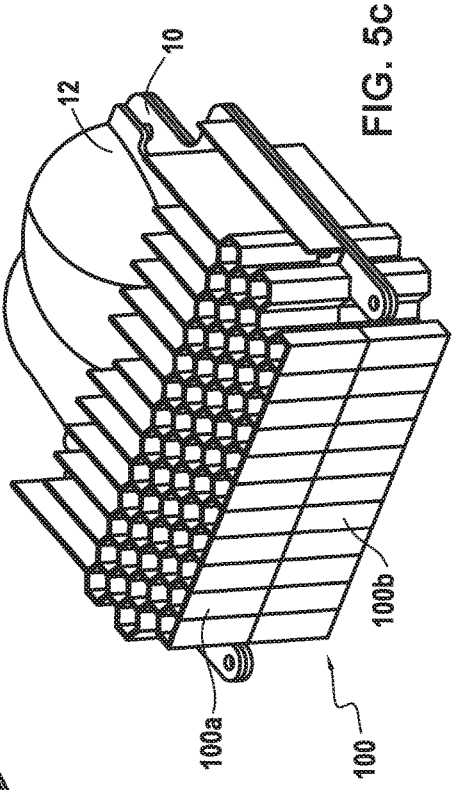

COOLING MEMBER FOR LIGHTING AND/OR SIGNALING SYSTEM

CROSS-REFERENCE TO RELATED APPLICATIONS

This application is the U.S. National Phase application of PCT Application No. PCT/EP2015/067992 filed Aug. 4, 2015, which claims priority to the French application 1458137 filed on Aug. 29, 2014, which applications are incorporated herein by reference and made a part hereof.

BACKGROUND OF THE INVENTION

1. Field of the Invention

The invention relates to the field of the lighting and/or signaling systems for motor vehicles. It relates more particularly to a cooling member for such a system.

A particularly advantageous but nonlimiting application of it is in the field of vehicle headlights.

2. Description of the Related Art

Motor vehicle headlights usually consist of a housing which is closed by a transparent wall through which one or more light beams emerge. This housing houses at least one optical module, mainly comprising a light source and an optical system suitable for modifying at least one parameter of the light generated by the light source for the emission of the light beam by the optical module.

The trend in the technology tends to favor the use of light sources made up of at least one LED (light-emitting diode), because of their low energy consumption, their small footprint and the quality of the lighting obtained.

However, the LEDs have the drawback that, in use, they produce heat which is damaging to their operation. In effect, the hotter an LED becomes, the more its light flux decreases.

When the optical module is designed to generate a beam requiring a strong light intensity, such as for low beams, high beams or fog lamps. The number of LEDs and/or the power necessary for their operation is high. As an indication, such a high operating power is likely to lie between 5 W and 60 W.

To ensure an effective cooling inside the housing above an operating power of 10 Watts (10 W), it is known practice from the document WO2005116520 to induce a forced passage of a flow of air along fins, according to the orientation of the general direction of emergence of the light from the optical module. The use of such a forced flow of air presents the drawback of having to implement specific means to provoke the flow of air and of increasing the bulk inside the headlight. The cost and the complexity of the headlight are also high.

It has also been proposed to arrange a heat dissipater in the form of fins or of a molded plate in contact with the LED. The documents FR2840151, which is equivalent to U.S. Publication 2004/0029436 which issued as U.S. Pat. No. 6,821,143, and FR2853200, which is equivalent to U.S. Publication 2004/00190294 which issued as U.S. Pat. No. 7,210,833, present this type of plate. These solutions have the drawback of offering a limited efficiency for discharging the calories.

Thus, despite the existing solutions, there is still a need to propose the solution for more effectively cooling a lighting and/or signaling system while retaining a limited bulk and complexity.

SUMMARY OF THE INVENTION

To achieve this aim, one aspect of the present invention relates to a cooling member for a lighting and/or signaling system for a motor vehicle, the member comprising a base having two opposite planar faces, at least one of which is configured to support a light source of the system and at least one heat dissipating device with a thermal conduction link to the base, the dissipating device comprising a plurality of dissipating elements. The dissipating element comprises at least one dissipating wall extending from a fixing face taken from one of the faces of the base and in a plane inclined relative to the plane of the fixing face, the dissipating wall or at least some of the dissipating walls of the dissipating element being prolonged respectively by a fixing portion by which the dissipating element is added and fixed to the fixing face, the fixing portion being formed of a single piece with the corresponding dissipating wall.

The invention thus makes it possible to form the base and the dissipating device separately. The base can then be manufactured by a method typically of injection molding, die stamping, drawing, even machining. That makes it possible to simplify the obtaining of a significant mass to favor the extraction of the calories from the LED and the absorption thereof within the base. For its part, the dissipating device can be produced by a method, typically of cutting and folding a metal sheet, simplifying the obtaining of a profile exhibiting a high air exchange surface area to mass ratio. That makes it possible to favor thermal dissipation into the air by convection.

The materials and manufacturing methods for the base and the dissipating device can therefore be chosen freely and independently.

It is thus possible to choose materials exhibiting a good heat exchange quality but significantly less costly.

Moreover, the fixing portions make it possible to improve the transfer of the calories from the base to the dissipating device, without it hampering the free circulation of the air along the dissipating walls.

Moreover, the dissipating walls extend from the fixing face or from the face opposite thereto, which increases the discharging of the calories from the base to the dissipating walls.

Moreover, the invention offers the possibility of arranging the fins overhanging while retaining a good contact surface area for the conduction and strength. The overhang allows the circulation of the air along the fins.

The connection of the LED by wire bonding means that the LED is directly in contact with the base, for example glued. Consequently, the propagation of the thermal energy from the source to the dissipaters is shorter and therefore more effective.

Optionally, the invention can also have at least any one of the following optional features taken separately or in combination:

The fixing portion is formed of a single piece with the dissipating wall and extending mainly in the plane of the fixing face; that makes it possible to increase the contact surface area between this dissipating wall and the base, thus favoring the thermal transfer to the dissipating wall.

The fixing portion and the corresponding dissipating wall are formed by a folded plate, a fold of this plate separating the fixing portion and the corresponding dissipating wall. According to an embodiment, the fixing portion and the dissipating wall are at an angle of 90° at the fold.

The dissipating element exhibits a discontinuity of material between the fixing portion of a first dissipating wall and a second dissipating wall adjacent to the first dissipating wall.

Each dissipating wall of each dissipating element is prolonged by a fixing portion by which the dissipating element is added and fixed to the base, the fixing portion being formed of a single piece with the dissipating wall.

The fixing portion extends at right angles to the dissipating wall that it prolongs so as to form a fin.

The dissipating element is fixed to the base only by the fixing portion.

The dissipating walls form fins.

The dissipating element is added to the base.

The dissipating wall extends mainly in a plane defined by a direction at right angles to the plane of the face of the base from which the dissipating wall extends and a direction parallel to the plane of the face.

The member comprises at least one distinct fixing portion for each dissipating wall.

The dissipating wall extends notably in a main extension direction which is parallel to the plane of the fixing face. A proximal portion of the dissipating wall is arranged in line with the fixing face and a distal portion of the dissipating wall is arranged overhanging relative to the fixing face. The distal portion arranged overhanging, taken in the main extension direction, has a length of at least 0.5 and preferably at least 0.75 the total length of the dissipating wall taken in this same main extension direction.

Thus, the dissipating element is mostly away from the base which favors the dissipation into the air of the heat transmitted from the base to the dissipating element.

Each dissipating element is formed by folding. Typically, it is formed from a folded plate or strip.

The folding of a dissipating element forms an air circulation channel delimited by two dissipating walls.

The channel is open at two of its ends in a direction at right angles to the face of the base on which the dissipating element is added.

In one embodiment, it is open in the main extension direction of the dissipating wall. In another embodiment, it is closed in the main extension direction. It then forms cells for example. The dissipater forms a cellular structure, each channel forming a cell.

The dissipating elements are linked to one another.

The dissipating elements are all formed of a single piece, two adjacent dissipating walls exhibiting a continuity of material.

The dissipating device is formed by folding one and the same part.

Preferably, the part is folded continuously according to a set of adjacent air convection channels. The folding forms, for example, a zig-zag shape.

Each dissipating element is formed by folding from a distinct part, the dissipating elements being individually added to the base.

each dissipating element consists of a distinct folded plate, the dissipating elements being distinct from the base and fixed thereto, notably by glue or by a weld.

They can be added in succession or preferably en bloc to the base.

The association of individual dissipating elements, preferably two individual elements, forms a channel.

According to one embodiment, the fixing portion of the first dissipating wall is added in contact with one out of: the second dissipating wall adjacent to the first dissipating wall or a fixing portion of the second dissipating wall.

Alternatively, the fixing portion of the first dissipating wall is added at a distance less than the distance D from one out of: the second dissipating wall adjacent to the first dissipating wall or the fixing portion of the second wall, the distance D being less than or equal to half the distance separating the first and second dissipating walls at the fixing portions. Preferably the distance D being less than or equal to a quarter of the distance separating the first and second dissipating walls at fixing portions. The distance D is measured in a direction parallel to the plane of the fixing face and in a direction at right angles to a main direction in which the dissipating walls extend. The distance D is measured at the proximal ends of two consecutive dissipating walls.

The thickness of the dissipating walls of the dissipating element is between 0.4 and 1 millimeter; the thickness of the base is between 2 and 6 millimeters; the distance between two adjacent dissipating walls is between 4 and 12 millimeters.

The base is taken from one of the following materials or an alloy based on one of the following materials: Aluminum 1050 or 1060.

The dissipating elements are taken from one of the following materials or an alloy based on one of the following materials: aluminum 1050 or 1060.

The dissipating device comprises at least one link element added to at least a plurality of, and preferably all, the dissipating walls and linking together the dissipating walls of the plurality.

The link element forms a bar fixed by welding or brazing to the dissipating walls of the plurality.

The link element forms a comb fitted onto the dissipating walls of the plurality.

The base is a molded or extruded material. According to a preferred embodiment, the base is molded and the fins consist of drawn plates. The drawn plates are a 90% aluminum alloy, which makes it possible to have an enhanced thermal conduction.

The dissipating device comprises at least one hook integral to a fixing portion and configured to cooperate with an opening formed in an adjacent fixing portion.

A fixing portion bears a male part configured to cooperate by fitting with a female part borne by an adjacent fixing portion, the cooperation of the male and female parts preventing the separation of the adjacent fixing portions by certain relative movements of the adjacent fixing portions.

According to one embodiment, the channels are formed by fins joined two-by-two to form a "U". According to one embodiment, the ends of the branches of the "U" rest partly on the base.

According to another aspect, the present invention relates to a lighting and/or signaling system for a motor vehicle comprising a cooling member according to the invention and an optical device configured to modify the direction of the light radiation emitted by the source.

According to one embodiment, the system comprises a light source supported by one of the opposite faces of the base.

According to one embodiment, the optical device of the lighting and/or signaling system comprises optical components which, for example, consist of a reflector, a lens, a diffusing element or a collimator, even any other member suitable for modifying at least one of the parameters of the light generated by the light source, such as its average reflection and/or its direction.

According to another aspect, the present invention relates to a method for producing a cooling member according to the invention, notably comprising the following steps:

producing the base;

producing the dissipating device by performing at least the following steps:

cutting a plate to form at least one part intended to form a dissipating wall of a dissipating element and at least one part intended to form a fixing portion prolonging the wall;

folding the plate so that the fixing portion is arranged in a plane inclined relative to the plane of the dissipating wall;

placing the dissipating element by fixing the fixing portion to a face of the base.

This method can be used to obtain a cooling member according to the invention.

Optionally, the invention, notably the method previously described, can also have at least any one of the following optional features taken separately or in combination:

The base is obtained by molding, injection molding, extrusion, drawing or machining.

The fixing of the fixing portion to a face of the base is performed by a thermal interface, for example glue.

According to one embodiment, at least a plurality of dissipating elements, and preferably all the dissipating elements, exhibit between them a continuity of material and are formed from one and the same plate.

The plurality of dissipating elements is added en bloc to the base.

Preferably, each dissipating element comprises two parallel dissipating walls. Preferably, each dissipating element comprises two parallel dissipating walls. According to one embodiment, each dissipating element comprises two parallel dissipating walls folded parallel to one another so as to form an open channel.

According to another embodiment, at least a plurality of dissipating elements, and preferably all the dissipating elements, are formed individually before being added to the face of the base.

Preferably, the dissipating elements are added en bloc to the face of the base.

Preferably, each dissipating element comprises two parallel dissipating walls.

These and other objects and advantages of the invention will be apparent from the following description, the accompanying drawings and the appended claims.

BRIEF DESCRIPTION OF THE ACCOMPANYING DRAWINGS

The aims, objects, and the features and advantages of the invention will become more apparent from the detailed description of an embodiment thereof which is illustrated by the following accompanying drawings in which:

FIGS. 3a to 3e illustrate several variants of the principle illustrated in FIGS. 1 and 2;

Figure 4C:
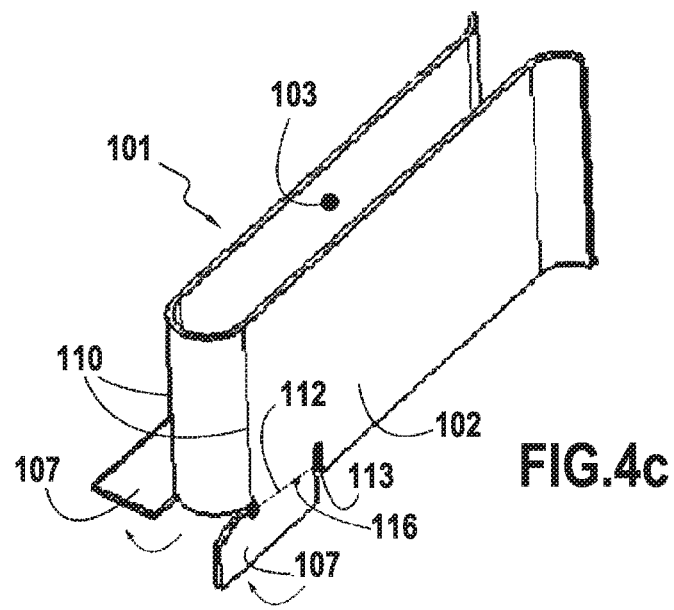
Figure 6B:
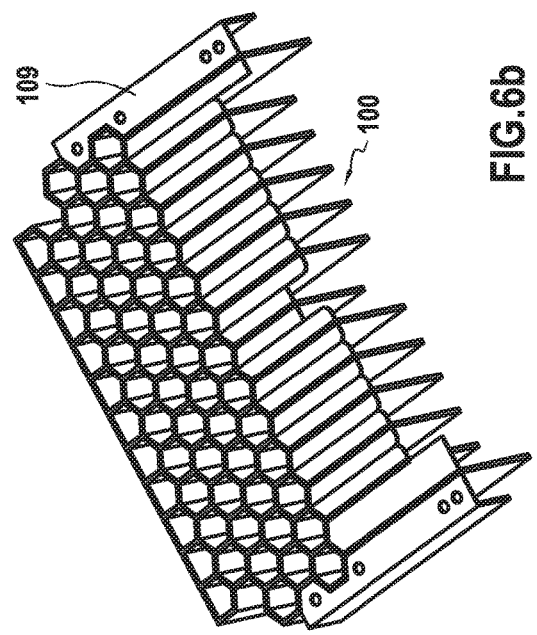
Figure 6A:
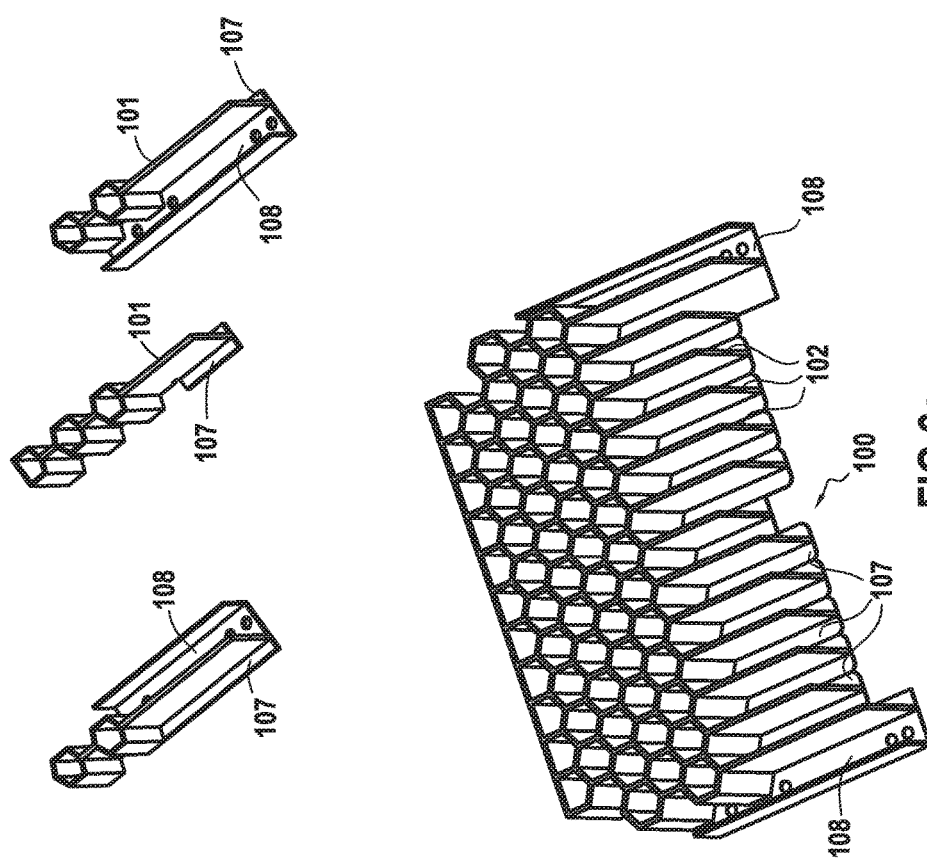

FIG. 4a gives a detailed illustration of an exemplary dissipating device;

FIGS. 4b to 4h illustrate several steps resulting in the obtaining of the dissipating device of FIG. 4a;

FIGS. 5a to 5c illustrate an embodiment in which the dissipating device forms cellular channels;

FIGS. 6a and 6b illustrate in detail a dissipating element of the dissipating device illustrated in FIGS. 5a to 5c; and FIGS. 7 to 10b illustrate several solutions making it possible to reinforce the fixing of the dissipating elements together forming the dissipating device.

The drawings are given by way of example and the invention is not limited thereto. They constitute schematic theoretical representations intended to simplify the understanding of the invention and are not necessarily to the scale of the practical applications.

In particular, the relative dimensions of the various elements are not necessarily representative.

DETAILED DESCRIPTION OF THE PREFERRED EMBODIMENTS

A first embodiment of the invention will now be described with reference to FIGS. 1 and 2.

The lighting and/or signaling system comprises one or more light sources 2. Preferably, they are LEDs. In this nonlimiting exemplary embodiment, there are three of them.

The LEDs 2 are electrically connected to an electronic circuit, for example in the form of a printed circuit 3 forming a rigid or flexible PCB (printed circuit board). The LEDs 2 are supported by a base 10. In a preferable but nonlimiting manner, the LEDs 2 are directly in contact with the base 10.

The base 10 thus forms a support for the LEDs 2. The base 10 also forms part of a cooling member 1 for the lighting and/or signaling system.

To this end, the base 10 has a thermal conduction link with the LEDs 2. It absorbs the heat produced by the LED 2 in order to cool the latter.

The cooling member 1 also comprises a heat dissipating device 100.

The dissipating device 100 has a thermal conduction link with the base 10. It also has a plurality of dissipating walls 102 (FIG. 6a) arranged in contact with the air and whose function is to dissipate by convection the calories transmitted from the base 10 to the dissipating device 100.

Thus, the heat generated by the LED 2 is extracted therefrom and transmitted by the base 10 by conduction. At least a part of the heat absorbed by the base 10 is then transmitted, mainly by conduction, to the dissipating device 100 which then dissipates it by convection into the surrounding environment, typically the air.

The base 10 comprises at least one portion which has two opposite and substantially planar faces. This base portion can thus be qualified as base plate in the example illustrated. According to other embodiments, the base 10 has portions additional to the base plate.

Figure 1:
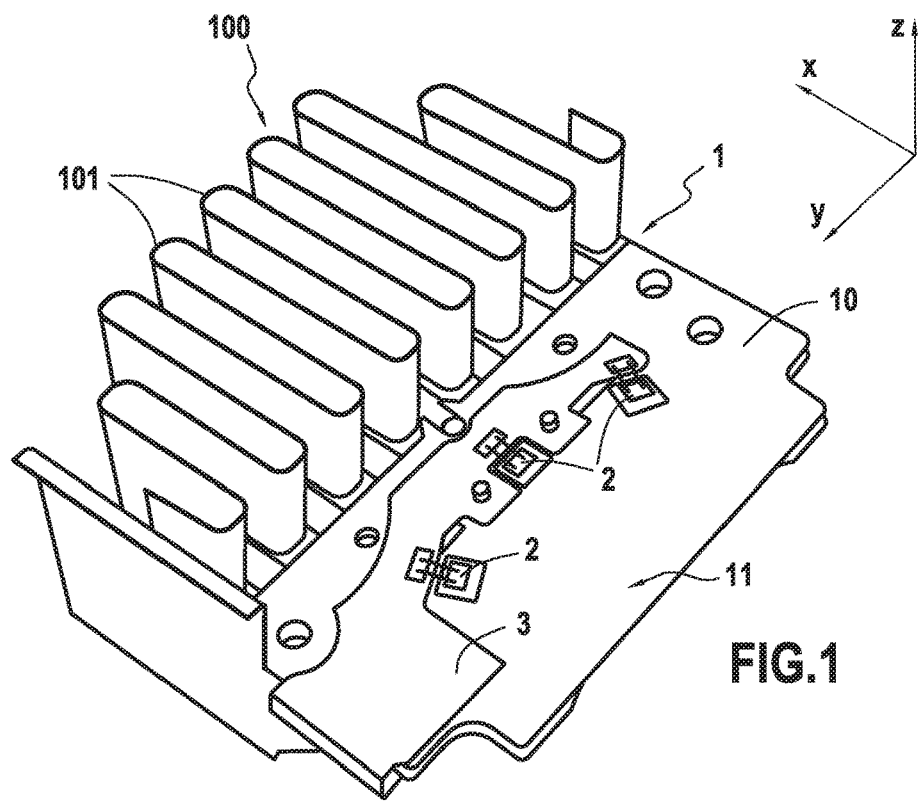
FIG. 1 represents an exemplary embodiment of the invention, in which the cooling member is associated with a card comprising a printed circuit (PCB)

These two faces are contained in parallel planes illustrated in FIG. 1. One of the substantially planar faces is configured to accommodate and support the LED 2.

Advantageously, at least one of these two faces is configured to cooperate with the dissipating device 100 in order to ensure the fixing thereof to the base 10. This face is hereinafter designated fixing face 11. In the example illustrated in FIG. 1, the top face, that supporting the LEDs 2, serves as fixing face 11 for the dissipating device 100 illustrated.

The dissipating device 100 has a plurality of dissipating elements 101 each bearing two dissipating walls 102a, 102b. These dissipating elements 101 are preferably arranged parallel to one another. The dissipating walls 102a, 102b extend from the base 10 and in a plane inclined relative to the plane xy of the faces of the base 10 and notably of the fixing face 11. As illustrated, they can extend in a plane at right angles to that of the faces of the base 10, that is to say along the plane zx.

Particularly advantageously, the dissipating elements 101 extend in the direction x, exhibiting an overhang relative to the base 10. These dissipating elements 101 are fixed to the base 10 over a portion of their dimension along the axis x which does not exceed 0.5 and preferably which does not exceed 20% of the total dimension of the dissipating element 101 in this direction x. That makes it possible to increase the exchange surface area between the dissipating element 101 and the surrounding air so as to optimize the dissipation of heat by convection.

Particularly advantageously, the dissipating elements 101 have fixing portions 107 (FIGS. 4a-4g) configured to ensure two functions:
the fixing of the dissipating element 101 to the base 10;
the transfer by conduction of the calories from the base 10 to the dissipating element 101.

These fixing portions 107 are adjacent to the dissipating walls 102. While the dissipating walls 102 are contained in a plane different from that of the fixing face 11 (plane xy), preferably at right angles (plane zx), the fixing portions 107 are contained in a plane parallel (xy) to that of the fixing face 11. That makes it possible to provide a significant contact surface area between the base 10 and the fixing portions 107 to increase the strength of the dissipating elements 101 and increase the transfer of the calories from the base 10 to the dissipating device 100.

Particularly advantageously, each fixing portion 107 prolongs one of the dissipating walls 102. They form one and the same part, preferably made of a single piece.

Advantageously, the dissipating wall 102 and the fixing portion 107 are obtained from one and the same plate or one and the same sheet and are folded to be arranged in two different planes.

Figure 4D:
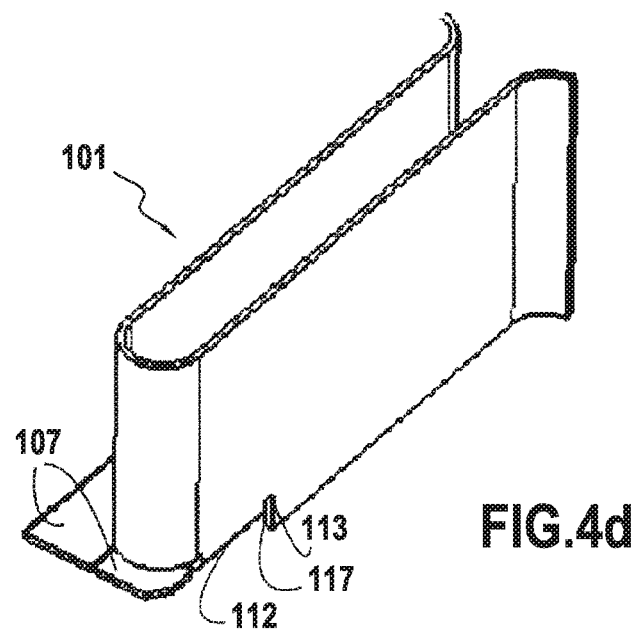
Figure 4E:
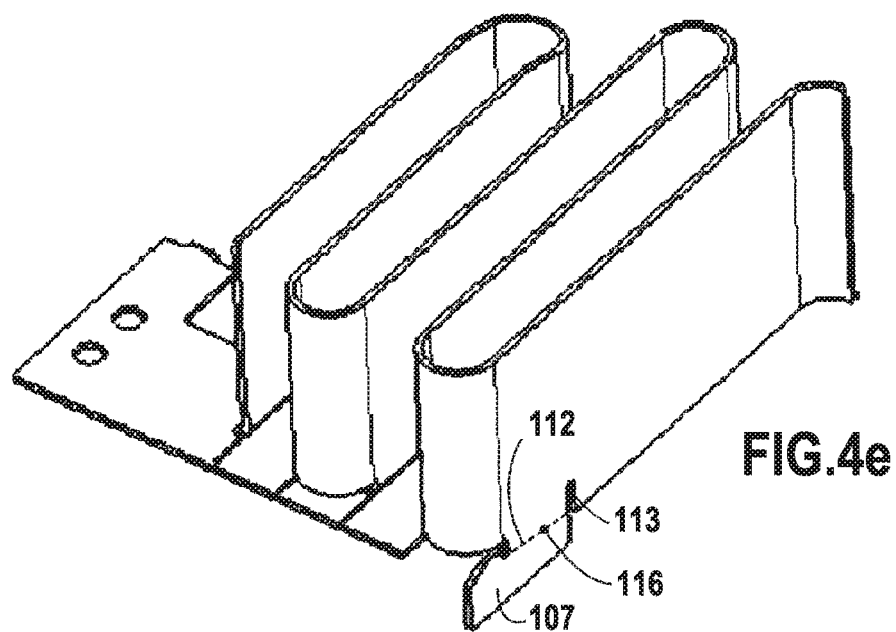

A join 116, illustrated in FIGS. 4c and 4e for example is thus represented thereby. This join 116 and this continuity of material enhance the transfer of the calories between the fixing portion 107 in contact with the base 10 and the dissipating walls 102.

Thus, and particularly advantageously, the dissipating device 100 is added to the base 10 and can therefore be produced independently of the base 10. The invention thus offers a great degree of freedom of choice both in materials and in the manufacturing methods for each of the base 10 and the dissipating element 101.

For example, the base 10 will be produced by molding or by injection molding (or die casting) or even by stamping or die-stamping. That makes it possible to obtain a base 10 simply and inexpensively, having a great thermal density in order to offer a high capacity to extract the heat from the LED 2 and to store it within the base 10. If the base 10 is formed by casting, an aluminum-based alloy, for example an alloy of aluminum and silicon, with a content by weight of approximately 11%, will for example be chosen. That makes it possible to facilitate the correct filling of the mold. If the base 10 is formed by stamping, it will then be possible to use aluminum or an aluminum alloy having a higher proportion of aluminum (typically greater than 90%). That makes it possible to improve the thermal conductivity of the base 10.

Regarding the dissipating device 100, it will be produced preferably from a previously cut plate or sheet. This technique makes it possible, unlike the casting or stamping, to easily obtain thin thicknesses. Typically, the thickness of the folded plate corresponds to the thickness of the dissipating walls 102. The dissipating elements 101 thus have a large surface area and small thicknesses making it possible thereby to optimize the exchange surface area with the air and very quickly dissipate the calories arriving from the base 10 at the dissipating device 100.

By injection, because of the clearances needed and the arrangement of the injectors, it would be much more difficult to obtain a great density of thin walls. Preferably, the dissipating elements 101 are made of aluminum.

The base 10 and the dissipating elements 101 thus have two complementary functions which, by synergy, allow for a very effective cooling of the LEDs 2.

The base 10 extracts the calories produced by the LEDs 2, stores them and can transfer them quickly to the dissipating elements 101 via the fixing portions 107. For their part, the dissipating elements 101 dissipate the calories added by the base 10 into the air by convection.

Figure 2:
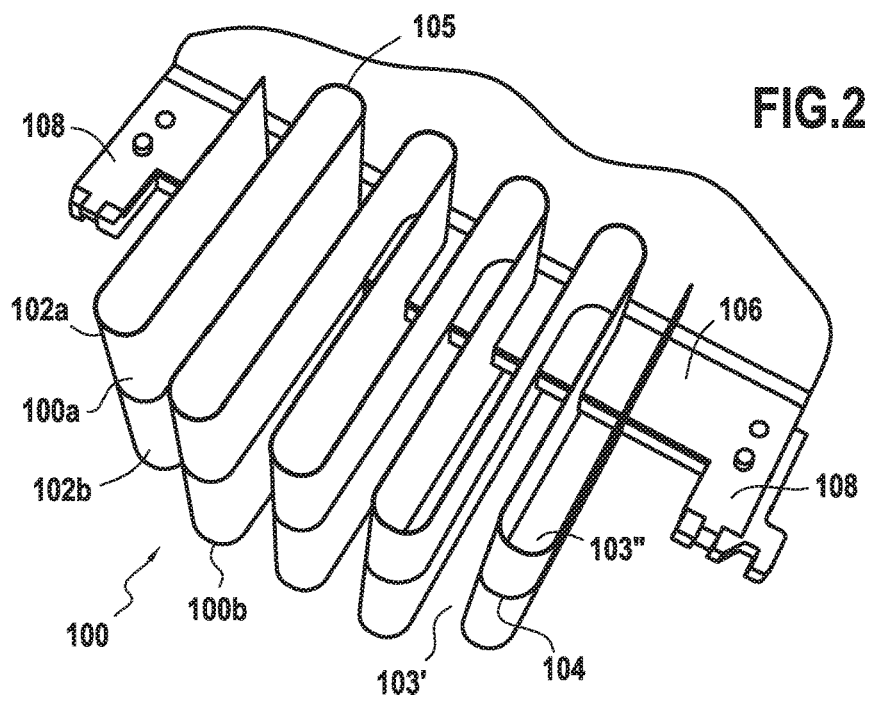
FIG. 2 represents another exemplary embodiment in which the cooling member comprises two dissipating elements associated with one and the same base.

As illustrated in FIG. 2, the fixing portions 107 of the dissipating elements 101 together form a mount 106 ensuring the fixing to the base 10 and the thermal exchange by conduction with the base 10. This mount 106 preferably comprises fixing ends 108 arranged in contact with the base 10 and on either side of the assembly formed by the dissipating walls 102.

In this example illustrated in FIGS. 1 and 2, the dissipating element 100 forms channels 103 (FIG. 5b) parallel to one another. These channels 103 are formed by a zig-zag folded strip. Two adjacent dissipating walls 102 are linked together by a fold.

Thus, certain channels 103' (FIG. 2) have a fold situated at a proximal end 105 arranged in line with the base 10 and an opening situated at a distal end 104. That makes it possible to promote a good circulation of the air at the distal end 104 of the wall along the axis x. A channel 103" (FIG. 2) adjacent to the channel 103', for its part, has a fold at its distal end 104 and an opening situated at a proximal end 105. That makes it possible to promote the circulation of the air at the base 10. This configuration therefore makes it possible to optimize the dissipation by convection of the calories stored by the walls or channels 103.

It will be noted that, particularly advantageously, the presence of the fixing portions 107 makes it possible to ensure a good thermal transfer between the base 10 and the dissipating device 100 while promoting the circulation of the air within the channels 103. In effect, these channels 103 are mostly open.

Compared to a configuration in which the channels 103 would be formed by fins joined two-by-two so as to form a "U", the ends of the branches of the "U" resting partly on the base 10 and extending along the dimension x, the invention offers the same advantage as previously. Moreover, it offers the advantage of not closing the channel 103 over its entire dimension along the axis x, but only over the portion of channel 103 in contact with the base 10, thereby enhancing the circulation of the air along the axis z, and the dissipation of the calories.

Compared to a configuration in which the channels 103 would be formed by fins joined two-by-two so as to form a "U", the bottom of the "U" extending at right angles to the base 10 and therefrom, the invention offers the advantage of increasing the exchange surface area between the dissipating elements 101 and the base 10 without hampering the circulation of the air.

Advantageously, and as illustrated in FIG. 2, the cooling member 1 comprises two dissipating devices 100a, 100b associated with one and the same base 10. The fixing portions 107 of the dissipating device 100a are fixed to the fixing face 11 whereas the fixing portions 107 of the dissipating device 100*b* are fixed to the face opposite the fixing face 11.

This configuration makes it possible to dissipate the calories even more effectively. Preferably, the dissipating walls 102*a* of the dissipating device 100*a* are situated in line with the dissipating walls 102*b* of the dissipating device 100*b*. Two dissipating walls 102*a*, 102*b* therefore together form one and the same dissipating wall 102*a*, of one and the same channel. The air can therefore more easily circulate along the axis z.

Figure 3E:
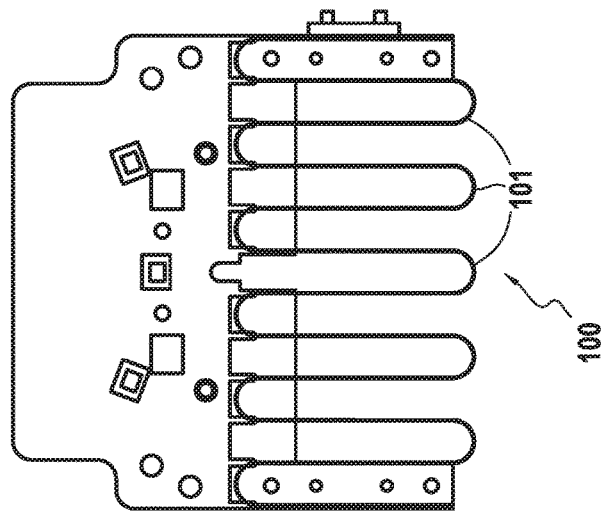
Figure 3C:
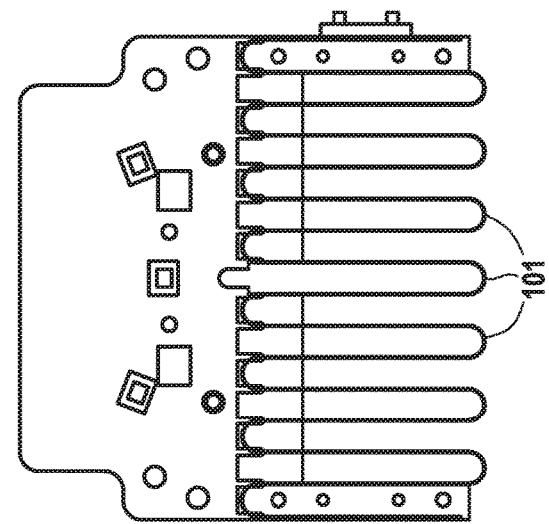

FIGS. 3*a* to 3*c* illustrate several variant embodiments of the invention which can all be adapted to one and the same base 10.

In each of these variants, the dissipating device 100 is preferably formed by a continuous plate folded so as to define the dissipating walls 102 parallel to one another and the fixing portions 107 at right angles to the dissipating walls 102. There is thus continuity of material between the dissipating elements 101.

FIG. 3*a* is a plan view (on the axis z) of the cooling member 1 illustrated in FIG. 1.

The dissipating device 100 comprises seven dissipating elements 101 together bearing 14 dissipating walls 102 and 13 channels 103. The distance between two dissipating walls 102 is consecutive and for example 6 mm. Two consecutive dissipating walls 102 are linked together by a rounded portion. The dissipating walls 102 situated at the end of the dissipating device 100 along the axis x are shorter than those situated at the center. That makes it possible to increase the exchange surface area with the central part of the base 10, so as to promote the dissipation of the calories while reducing the footprint and the weight at the point where a less strong dissipation is required.

FIG. 3*b* is a plan view of the cooling member 1 of FIG. 2. Compared to the variant of FIG. 3*a*, that of FIG. 3*b* has a lower density of dissipating walls 102 and therefore of channels 103, here 10 and 9 respectively.

The weight of the dissipating device 100 is therefore reduced compared to that of FIG. 3*a* but the exchange surface area is smaller. This embodiment will be preferred for systems generating less heat than those associated with the cooling member 1.

Figure 3D:
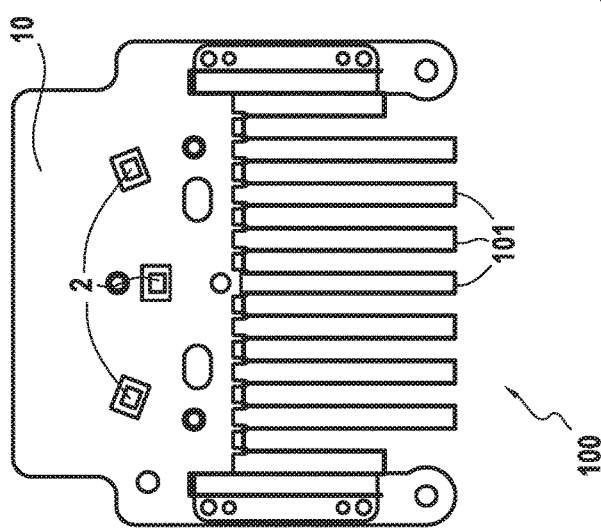

FIGS. 3*c* to 3*e* show dissipating elements 101 which all have the same length. The variant of FIG. 3*c* has dissipating walls 102 linked two-by-two by right-angled folds. The bottom of the "U" thus forms a right angle with the branches of the "U". The space between two dissipating walls 102, in this nonlimiting example, measures 4 mm.

The variants of FIGS. 3*d* and 3*e* represent rounded folds between two consecutive dissipating walls 102. Typically, these cooling members weigh between 102 g (variant of FIG. 3*b*) and 130 g (variant of FIG. 3*d*). The dissipating walls 102 being formed in aluminum and from a folded plate and the base 10 being made of aluminum alloy and silicon formed by injection molding, forming or cutting.

FIGS. 4*b* to 4*h* illustrate certain steps in producing a dissipating device 100 illustrated in FIG. 4*a* and which is similar to that illustrated in FIG. 2.

FIG. 4*b* shows the cut plate, before folding, which will be used to form all the dissipating device 100 of FIG. 4*a*.

This plate forms a flat element, of substantially longitudinal form, delimited by two longitudinal edges 119 each extending along the axis y. This plate defines the two fixing ends 108, the fixing portions 107 and fold lines 110, 111, 112.

The fold lines 110, 111 extend transversely from one longitudinal edge 119 to the other. The fold lines 110, 111 are intended to form the join two consecutive dissipating walls 102 (that is to say the bottom of a "U").

Depending on the folding and the arrangement of the fold lines 110, 111, the bottom of the "U" will be rounded or flat.

The lines 110 define the folds at the proximal ends 105 whereas the folds 111 define the folds at the distal ends 104.

The fixing portions 107 are defined by cuts 113, 114, 115 and each have a join 116 with the dissipating wall 102 with which it is associated. This join 116 is intended to be folded to allow the dissipating wall 102 to be contained in the plane zx and the fixing portion 107 to be contained in the plane xy.

FIG. 4*c* illustrates a portion of plate after folding at the folds 110 and 111. This portion of plate has two dissipating walls 102 defining a channel 103.

The fixing portion 107 arranged on the left has been folded. It thus extends in the plane xy. The fixing portion 107 arranged to the right has not yet been folded and will be folded at the fold line 112 of the join 116 as illustrated in FIG. 4*d*.

This figure clearly shows the clearance of an edge 117 formed by the cutting line 113 and which appears after the folding. This edge 117 is intended to abut against the thickness of the base 10 to facilitate the positioning and the holding in position of the dissipating device 100 on the base 10.

FIG. 4*e* illustrates a partial view of the folded plate showing the juxtaposition of five dissipating walls 102. The fixing portions 107 are folded and juxtaposed to one another. They thus form a continuous mount 106 (FIG. 2) which optimizes the contact surface area 109 (FIG. 4*h*) between the dissipating device 100 and the base 10. For its part, the fixing portion 107 is illustrated in a non-folded position.

Figure 4F:
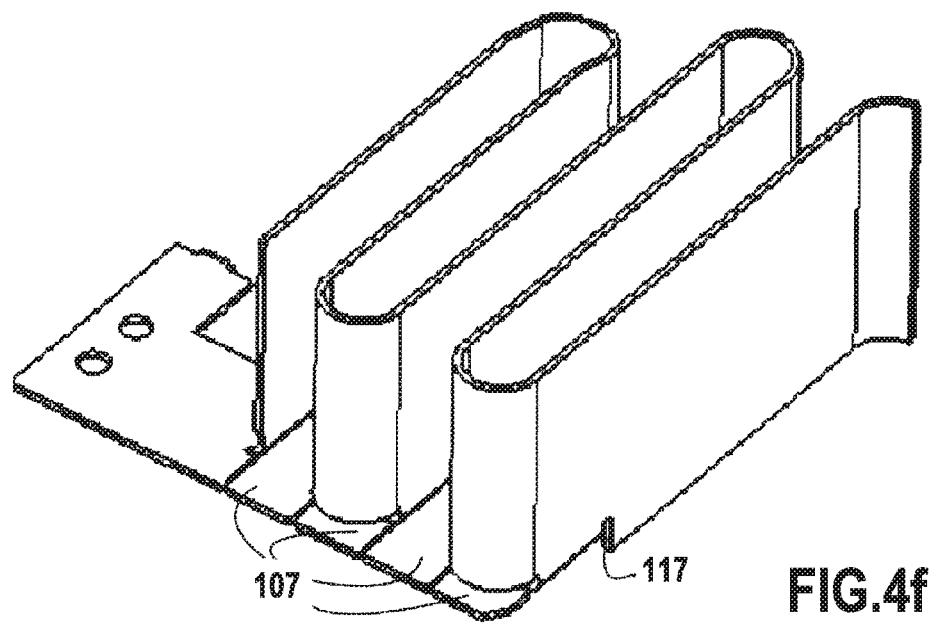

According to FIG. 4*f*, this fixing portion 107 is folded by being bent back under the bottom of the "U". Thus, all the fixing portions 107 are bent back by the same direction of rotation.

It will be noted that this structure also allows for a contact between the fixing portion 107 and the bottom of the "U", which enhances the propagation of the calories from the fixing portion 107 to the bottom of the "U" and dissipating walls 102 adjacent to the "U".

Figure 4G:
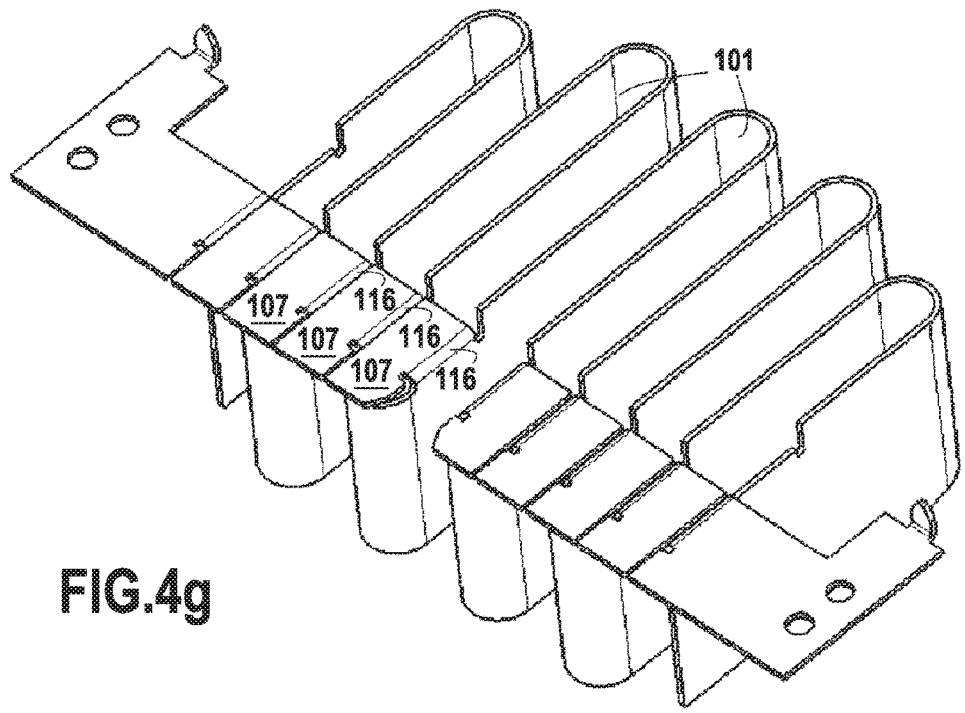
Figure 4H:
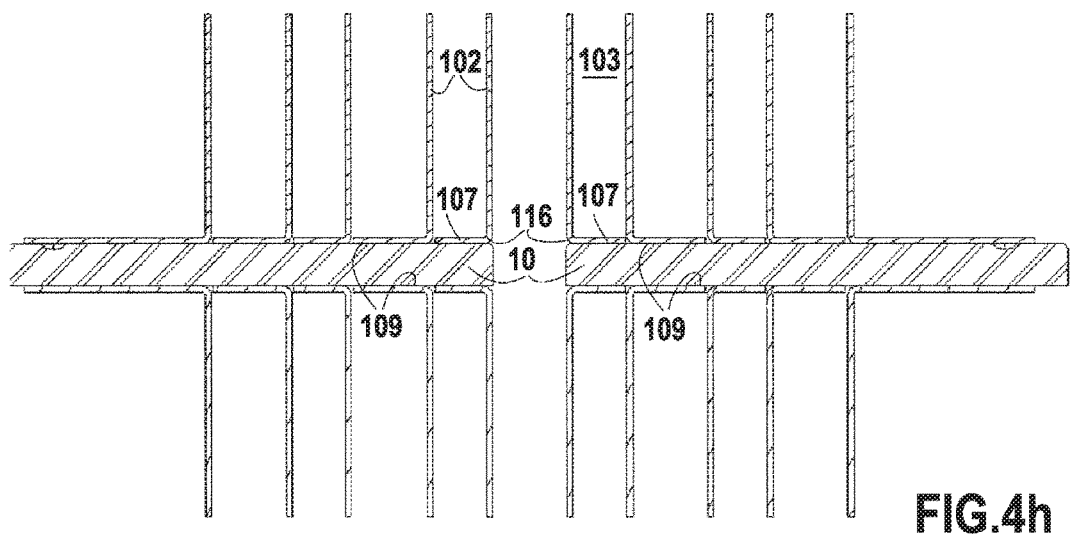

FIG. 4*g* illustrates the dissipating device 100 seen from below when it is entirely folded. FIG. 4*h* illustrates the dissipating device 100 seen in cross section along a plane xz.

In these last two figures, it can clearly be seen that the fixing portions 107 form a mount 106 with no empty space to increase the contact surface area 109 with the base 10.

Thus, particularly advantageously, two adjacent fixing portions 107 have a discontinuity of material but are attached or are away from one another by a small distance D. D is typically less than $\frac{1}{10}$ of the distance separating the two adjacent dissipating walls 102 at their proximal ends 105. This distance D is measured in a direction at right angles to the direction in which the dissipating walls 102 extend, in the examples illustrated, the direction y.

In all the embodiments described above, the air can circulate in channels 103 freely, along the axis z, and also along the axis x, apart from either at the proximal end 105 or at the distal end 104 of the channel 103.

FIGS. 5*a* to 5*c* and 6*a* and 6*b* illustrate another embodiment of the invention in which the dissipating elements 101 form channels 103 that have, in section, a closed outline. In this nonlimiting example, the channels 103 extend along the axis z. They have, in cross section, along the plane xy, a closed outline, here a cellular outline.

Preferably, each dissipating element 101 has a proximal portion forming a rectilinear wall extending along the axis x and which is prolonged by several cell-form channels 103.

Preferably, each dissipating element 101 is obtained individually. It is not formed of a single piece with the dissipating element 101 which is adjacent to it.

The assembly of the dissipating elements 101 forms the dissipating device 100. Preferably, the juxtaposition of two dissipating elements 101 forms, between these dissipating elements 101, cells. The assembly obtained forms a continuously cellular structure.

Preferably, a dissipating element 101 is obtained by folding on itself a sheet of metal or a plate. The two ends of the plate being fixed to one another after folding, this fixing being ensured preferentially by clinching, crimping or by electrical welding.

Advantageously, each rectilinear portion is formed by two dissipating walls 102 folded over one another. Each dissipating wall 102 is prolonged by a fixing portion 107 folded in the plane at right angles to that of the dissipating walls 102. The dissipating elements 101 are thus formed individually, but possibly simultaneously. They are then assembled and fixed to one another, preferably by clinching, crimping or by electrical welding. The assembly thus constructed forms the dissipating device 100 illustrated in FIGS. 6a and 6b. It constitutes a subassembly ready to be added to the base 10.

A so-called submount method can be used in which an element, for example the diode 2, is fixed directly onto a support, here the base 10, via glue or welding to optimize the thermal dissipation. This method involves the disappearance of the metal substrate on which the diode 2 is mounted. A wire bonding is therefore generally produced to a PCB 3 away from the diode 2, here a flexible PCB 3 which thus links the diode 2 to a driving circuit.

Preferably, the fixing portions 107 extend over all of the dimension along the axis x of the proximal rectilinear portion. The continuous juxtaposition of these fixing portions 107 forms the fixing mount 106, as illustrated in FIG. 6b, and it is this fixing mount 106 which defines the contact surface area 109 between the dissipating device 100 and the base 10.

Thus, and as described for the preceding embodiment, two adjacent fixing portions exhibit a discontinuity of material but are attached or are away from one another by a small distance D, typically less than 1/10 of the distance separating the two adjacent dissipating walls 102 at their proximal ends 105.

Preferably, as illustrated in FIG. 5c, two dissipating devices 100a, 100b, are added on each of the faces of the base 10. Each cellular channel 103 formed by one of the dissipating devices 100a, 100b is prolonged by a cellular channel 103 of the other dissipating device 100a, 100b.

To facilitate production and reduce the costs, the dissipating devices 100a, 100b are identical.

In this embodiment, a reflector 12 is provided, arranged on the face of the base 10 which supports the LED 2.

This embodiment thus offers a structure having an optimized exchange surface area and allowing a free circulation of the air in the channels 103 along the axis z.

Depending on the constraints of weight and of thermal power to be dissipated, the density of the cells will be varied for one and the same footprint.

FIGS. 7 to 10b illustrate several exemplary embodiments making it possible to reinforce the robustness of the dissipating device 100. These embodiments can be combined with one another and with the embodiments described with reference to the preceding figures.

These embodiments will be highly advantageous if they are applied to dissipating elements 101 obtained individually and fixed to one another to form a dissipating device 100. Nevertheless, they apply equally to the cases where the assembly of the dissipating elements 101 is formed of a single piece, typically by folding a single sheet of metal.

Figure 7:
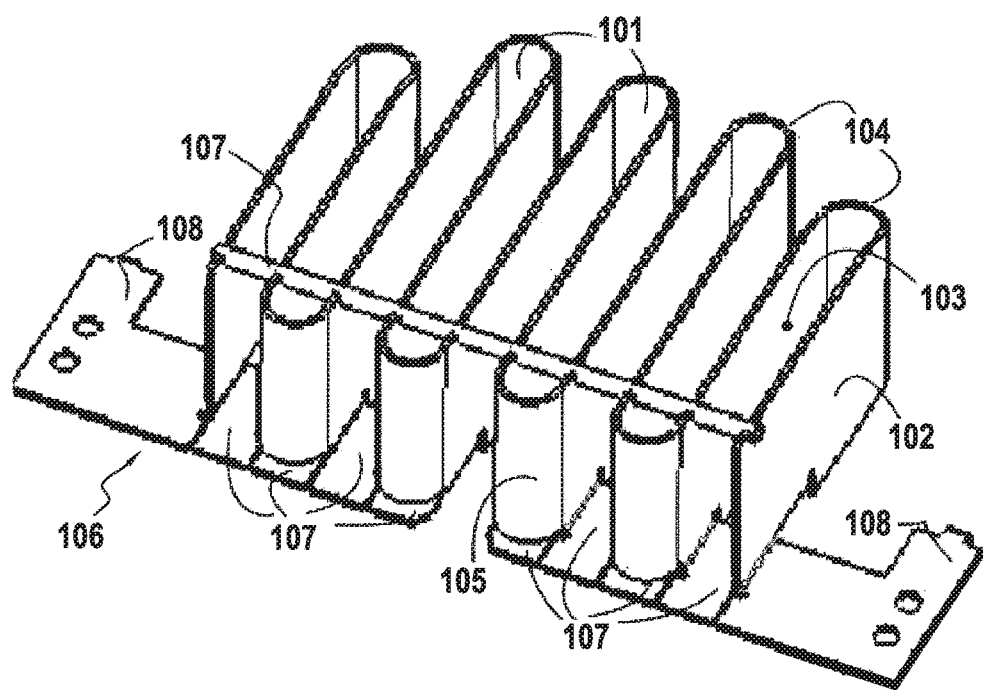

In this embodiment of FIG. 7, a bar 130 is provided that is integral with some and preferably integral with all of the dissipating walls 102.

Advantageously, an edge of the dissipating walls 102 has a notch complementing the form of the bar 130 and configured to house at least a part of the bar 130.

The bar 130, once inserted into the notch, can be fixed to the dissipating walls 102 by welding or brazing. Thus, the cohesion of the dissipating walls 102 is reinforced.

Figure 8A:
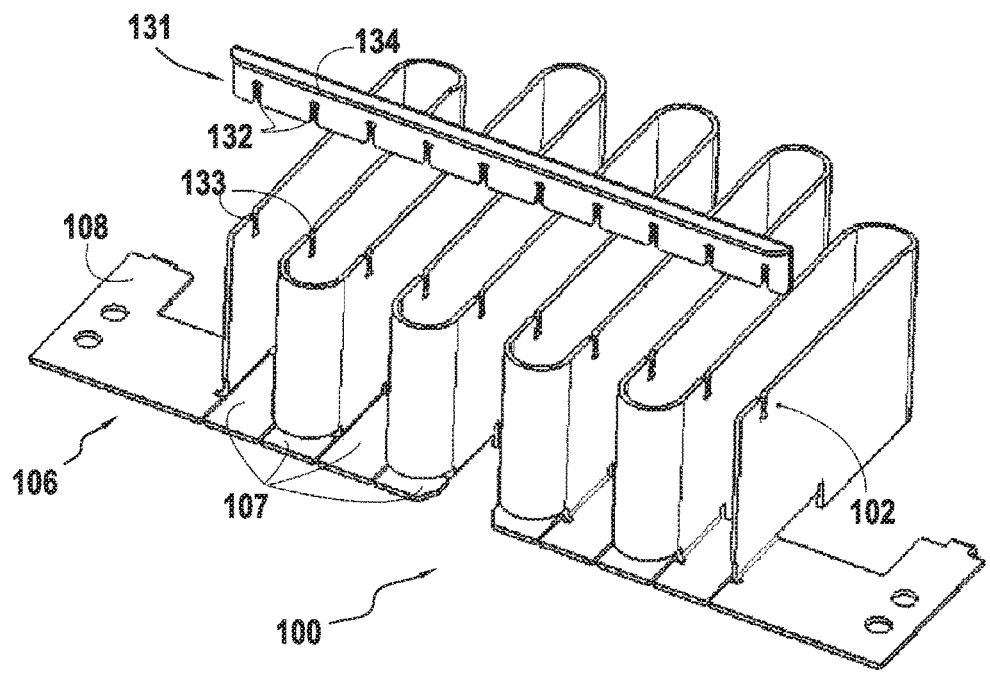
Figure 8B:
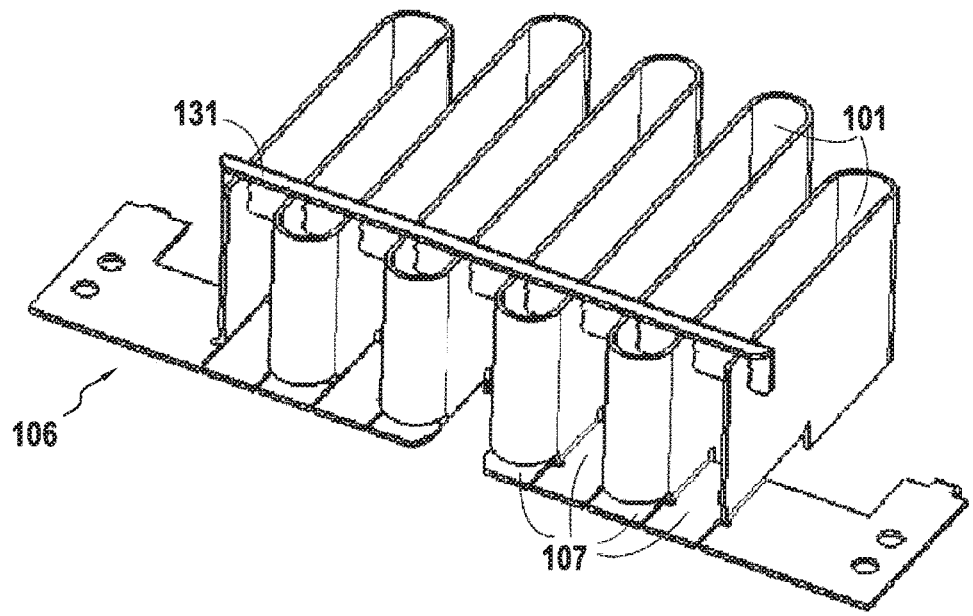

FIGS. 8a and 8b illustrate an embodiment in which the base 10 has a comb form 131 having slits 132 arranged longitudinally along the axis y and configured to be penetrated by the dissipating walls 102.

Preferably, the dissipating walls 102 also have slits 133 configured to receive the comb 131 at the slits 132. The fitting of the slits 132 into the slits 133 allows for a good fixing of the comb 131 to the dissipating walls 102, a fixing that is reinforced as required by welding or brazing.

Preferably, the comb 131 is obtained by cutting a metal sheet, notably to form the slits 132 and by folding one edge to form a rib 134 reinforcing the robustness of the assembly.

Figure 9A:
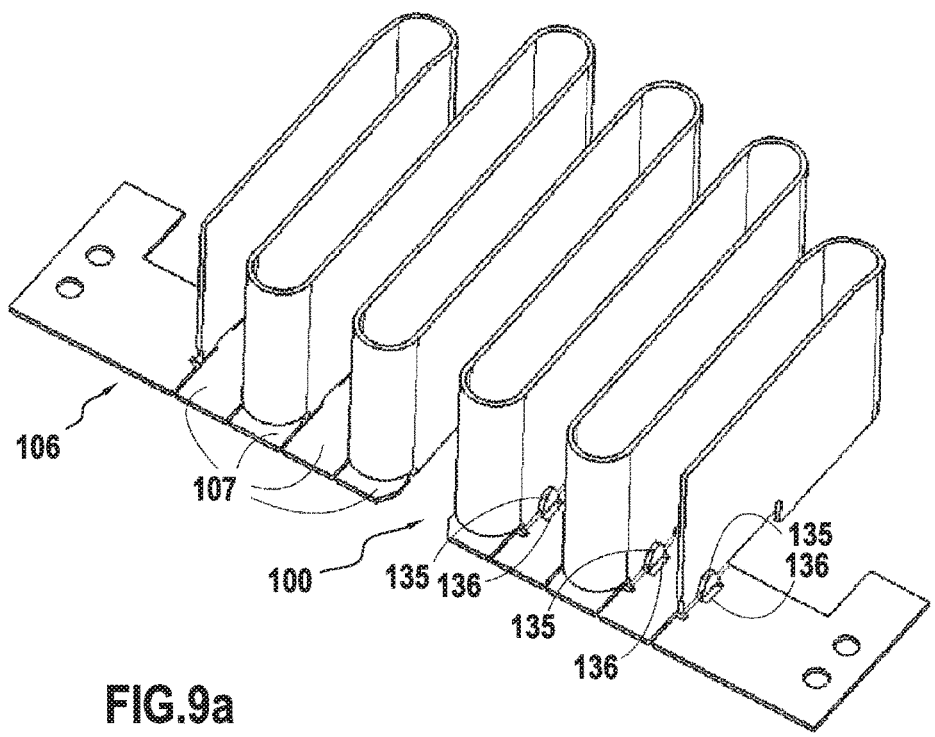
Figure 9B:
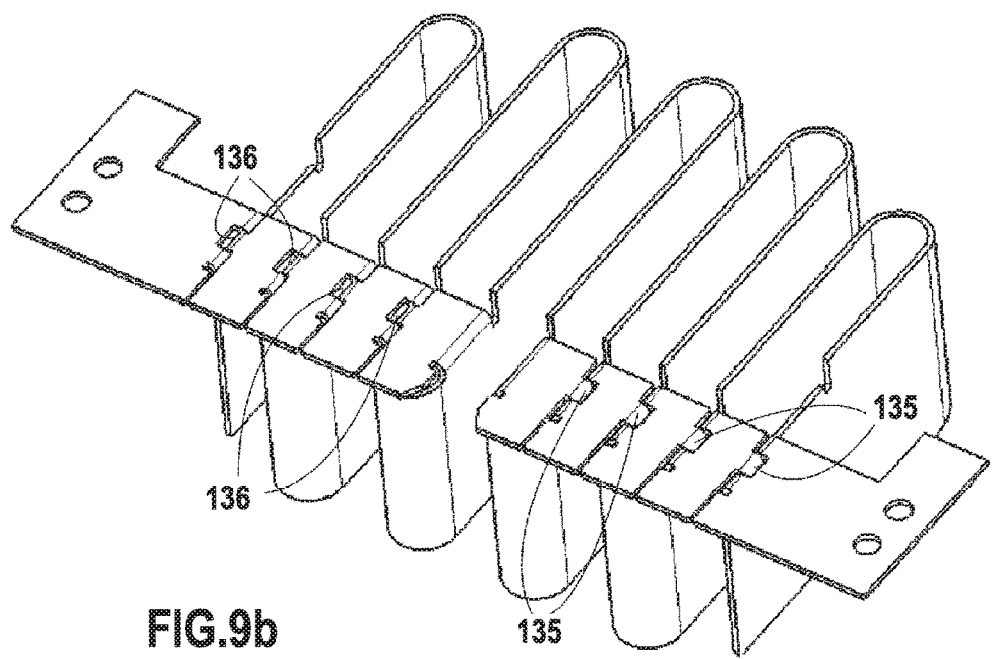

FIGS. 9a and 9b illustrate an embodiment in which hooks 135 reinforce the fixing between the fixing portion 107 of a first dissipating wall 102 and a second dissipating wall 102 adjacent to this first dissipating wall 102.

A hook 135 borne by the fixing portions 107 of the first dissipating wall 102 is provided to penetrate into an opening 136 formed in the second dissipating wall 102 and in proximity thereto. The hook 135 is configured to engage with the second dissipating wall 102.

Advantageously, the hooks 135 form part of the metal sheet forming the dissipating walls 102.

To ensure the activation of the hook 135 fixing after the juxtaposition of the dissipating walls 102 and of the fixing portions 107, the hooks 135 are folded by bending them back so as to make them penetrate into the opening 136 of the adjacent fixing portion 107.

Figure 10A:
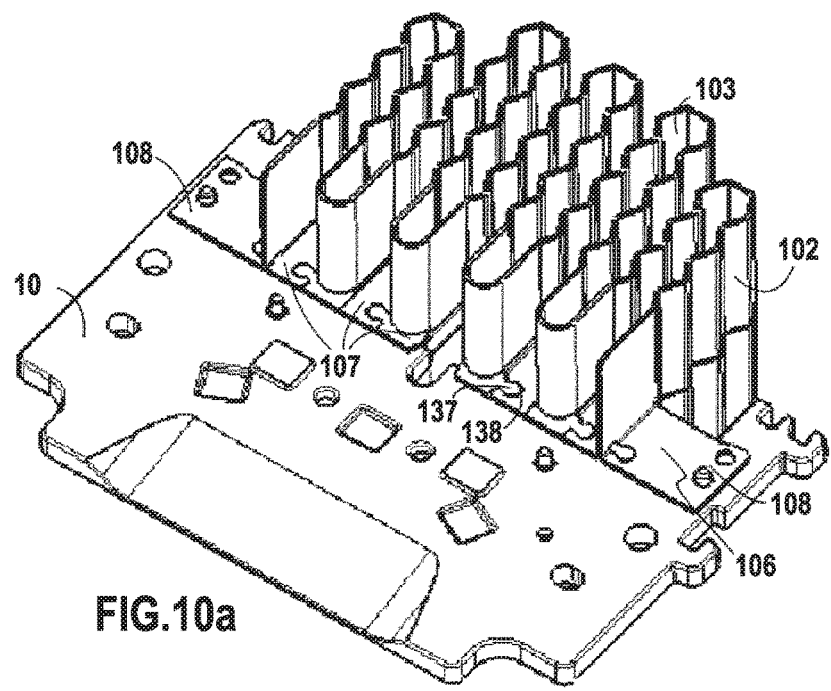
Figure 10B:
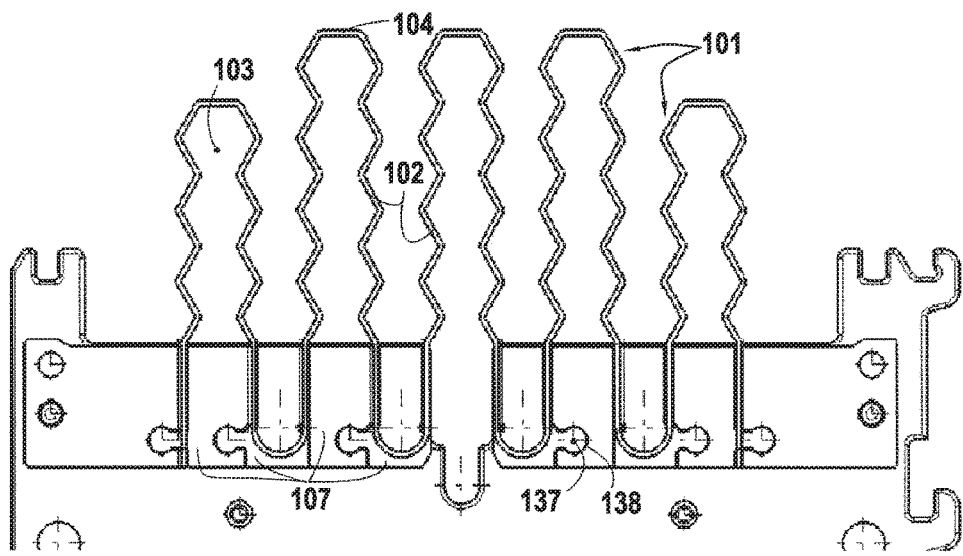

FIGS. 10a and 10b illustrate an embodiment in which two consecutive fixing portions 107 have a male part 137 and a female part 138 configured to cooperate with one another so as to ensure an immobilizing of the two fixing portions 107.

As illustrated in these figures, the fixing portions 107 bearing these two male and female parts 137, 138 form two pieces of a puzzle. That makes it possible to facilitate the mutual positioning and holding in position of the dissipating elements 101. Thus, a fixing portion 107 bears a male part 137 configured to cooperate by fitting with a female part 138 borne by a fixing portion 107 which is adjacent to it. The dissipating device 100 is configured so that the cooperation of the male and female parts 137, 138 prevents the separation of the adjacent fixing portions 107 when the adjacent fixing portions 107 are displaced relatively in a direction (direction X or Y) parallel to the plane of the faces of the base 10. On the other hand, a relative displacement of the fixing portions 107 in a direction (direction Z) at right angles to the plane of the faces of the base 10 allows for a separation of the fixing portions 107.

Also, the dissipating walls 102 of the dissipating device 100 have a particular form based on the embodiment illustrated in FIGS. 4a to 4h, but modified to also approximate the advantages of the cellular embodiments described previously. Unlike the dissipating walls 102 illustrated in FIGS. 4a to 4h, the latter are corrugated instead of being planar. The exchange surface is thus increased.

The corrugation thus generates an alternation of dips and peaks on the faces of the dissipating walls 102. As in the example illustrated, the peaks of the faces of two adjacent dissipating walls 102 forming an air channel, these faces facing one another, are opposite to one another. Similarly, the dips of these faces are opposite to one another.

This corrugation can for example be formed by a plurality of successive folds, for example the dissipating walls being in zig-zag form. From the above description, it clearly emerges that the invention offers a particularly effective solution for dissipating the calories stored by the base 10. The arrangement of the dissipating walls 102, in particular their overhang relative to the base 10, their forming possibly by folding, the free circulation of air that they allow and the good thermal transfer between the base 10 and the dissipating walls 102, reinforce the effectiveness of the thermal dissipation.

The invention is not limited to the embodiments previously described and extends to all the embodiments covered by the claims.

In particular, the invention extends to dissipating devices 100 formed by dissipating elements 101 produced individually then assembled together or, on the other hand, from dissipating elements 101 linked together and formed from one and the same family of metal.

Moreover, the invention is not limited to walls and channels having the forms illustrated in the figures. It encompasses any form of walls and channels and extends in particular to walls forming fins.

While the system, apparatus, process and method herein described constitute preferred embodiments of this invention, it is to be understood that the invention is not limited to this precise system, apparatus, process and method, and that changes may be made therein without departing from the scope of the invention which is defined in the appended claims.

What is claimed is:

1. A cooling member for a lighting and/or signaling system for a motor vehicle, said cooling member comprising:
    a base having two opposite faces, at least one of said two opposite faces is configured to support a light source of said lighting and/or signaling system; and
    at least one heat dissipating device including a thermal conduction link to said base, said at least one heat dissipating device including a plurality of dissipating elements, wherein each dissipating element of said plurality of dissipating elements includes two dissipating walls extending from a fixing face taken from one of said two opposite faces of said base and in a plane inclined relative to a plane of said fixing face, each of said dissipating walls being prolonged by a fixing portion by which said plurality of dissipating elements are added and fixed to said fixing face, said fixing portion being formed of a single piece with a corresponding dissipating wall and extending mainly in the plane of said fixing face, said fixing face and said base forming a single plane.

2. The cooling member as claimed in claim 1, wherein said fixing portion and the corresponding dissipating wall are formed by a folded plate, a fold of said folded plate separating said fixing portion and the corresponding dissipating wall.

3. The cooling member as claimed in claim 1, wherein said fixing portion of a first dissipating wall is added in contact with a second dissipating wall adjacent to said first dissipating wall or said fixing portion of said second dissipating wall.

4. The cooling member as claimed in claim 1, wherein said fixing portion of a first dissipating wall is added at a distance less than a distance D from a second dissipating wall adjacent to said first dissipating wall or said fixing portion of said second dissipating wall, said distance D being less than or equal to half of a distance between said first and second dissipating walls at said fixing portions.

5. The cooling member as claimed in claim 1, wherein said fixing portion extends at right angles to the corresponding dissipating wall and forms a fin.

6. The cooling member as claimed in claim 1, wherein said dissipating element forms an air circulation channel delimited by said two dissipating walls, said air circulation channel being open at two of its ends in a direction at right angles to said fixing face and said air circulation channel is open in a main extension direction in which said dissipating walls extend.

7. The cooling member as claimed in claim 1, wherein said dissipating element forms an air circulation channel delimited by said two dissipating walls, said air circulation channel being open at two of its ends in a direction at right angles to said fixing face and said air circulation channel is closed in a main extension direction.

8. The cooling member as claimed in claim 1, wherein said dissipating elements are all formed of a single piece, said two adjacent dissipating walls exhibiting a continuity of material.

9. The cooling member as claimed in claim 1, wherein each dissipating element includes a distinct folded plate, said dissipating elements being distinct from said base and fixed thereto, notably by glue or by a weld.

10. The cooling member as claimed in claim 1, wherein said at least one heat dissipating device includes at least one link element added to said dissipating walls and linking together said dissipating walls.

11. The cooling member as claimed in claim 1, wherein said at least one dissipating device includes at least one hook integral to said fixing portion and configured to cooperate with an opening formed in an adjacent fixing portion.

12. The cooling member as claimed in claim 1, wherein said fixing portion bears a male part configured to cooperate by fitting with a female part borne by an adjacent fixing portion, the cooperation of said male and female parts being configured to prevent a separation of said adjacent fixing portions by certain relative movements of the said fixing portions.

13. A lighting and/or signaling system for a motor vehicle comprising:
    the cooling member as claimed in claim 1;
    the light source supported by one of said opposite faces of said base; and
    an optical device configured to modify a direction of a light radiation emitted by said light source.

14. The cooling member as claimed in claim 2, wherein said fixing portion and the corresponding dissipating wall are at an angle of 90° at said fold.

15. The cooling member as claimed in claim 2, wherein said fixing portion of a first dissipating wall is added in contact with a second dissipating wall adjacent to said first dissipating wall or said fixing portion of said second dissipating wall.

16. The cooling member as claimed in claim 14, wherein said fixing portion of a first dissipating wall is added in contact with a second dissipating wall adjacent to said first dissipating wall or said fixing portion of said second dissipating wall.

17. The cooling member as claimed in claim 7, wherein said at least one heat dissipating device forms a cellular structure, each air circulation channel forming a cell.

18. A method for producing a cooling member, the cooling member including a base having two opposite faces, at least one of which is configured to support a light source of said lighting and/or signaling system, and the cooling member further including at least one heat dissipating device with a thermal conduction link to said base, said at least one heat dissipating device including a plurality of dissipating elements, wherein each dissipating element of said plurality of dissipating elements includes two dissipating walls extending from a fixing face taken from one of said two opposite faces of said base and in a plane inclined relative to the plane of said fixing face, each of said dissipating walls being prolonged by a fixing portion by which said plurality of dissipating elements are added and fixed to said fixing face, said fixing portion being formed of a single piece with the corresponding dissipating wall and extending mainly in the plane of said fixing face, said fixing face and said base forming a single plane, said method comprising the following steps:

producing said base;

producing said at least one dissipating device by performing at least the following steps:

cutting a plate to form at least one part intended to form said dissipating walls and at least one part intended to form said fixing portion prolonging said dissipating walls;

folding said plate so that the said fixing portion is arranged in a plane inclined relative to the plane of said dissipating walls; and placing said dissipating element by fixing said fixing portion to a face of said base.

19. The method as claimed in claim 18, wherein said plurality of the dissipating elements exhibit between them a continuity of material and are formed from one and the same plate.

20. The method as claimed in claim 18 wherein said plurality of dissipating elements are formed individually before being added to the face of said base.

* * * * *